United States Patent
Chang (10) Patent No.: US 9,761,464 B2
(45) Date of Patent: Sep. 12, 2017

(54) POWER MOSFET AND MANUFACTURING METHOD THEREOF

(71) Applicant: Excelliance MOS Corporation, Hsinchu County (TW)

(72) Inventor: Yi-Chi Chang, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 14/727,872

(22) Filed: Jun. 2, 2015

(65) Prior Publication Data

US 2016/0307835 A1 Oct. 20, 2016

(30) Foreign Application Priority Data

Apr. 15, 2015 (TW) .............................. 104112061 A (51) Int. Cl.
*H01L 23/053* (2006.01)
*H01L 21/48* (2006.01)
(Continued)

(52) U.S. Cl.
CPC ........ *H01L 21/4853* (2013.01); *H01L 21/486* (2013.01); *H01L 21/78* (2013.01);
(Continued)

(58) Field of Classification Search
None
See application file for complete search history.

(56) References Cited

U.S. PATENT DOCUMENTS 6,392,290 B1 5/2002 Kasem et al.
6,846,719 B2 * 1/2005 Tong ....................... H01L 24/11
257/734
(Continued)

FOREIGN PATENT DOCUMENTS

TW 200713609 4/2007
TW 200811972 3/2008
(Continued)

OTHER PUBLICATIONS

"Office Action of Taiwan Counterpart Application", issued on Jul. 1, 2016, p. 1-p. 5.
(Continued)

*Primary Examiner* — Mark Tornow
*Assistant Examiner* — Priya Rampersaud
(74) *Attorney, Agent, or Firm* — Jianq Chyun IP Office (57) ABSTRACT

A power MOSFET includes a substrate, a dielectric layer, solder balls, first and second patterned-metal layers. The substrate includes an active surface, a back surface, a source region and a gate region on the active surface, and a drain region on the back surface. The first patterned-metal layer disposed on the active surface includes a source electrode, a gate electrode, a drain electrode and a connecting trace. The source and gate electrodes electrically connect the source and gate regions. The connecting trace located at an edge of the substrate electrically connects the drain electrode. The dielectric layer disposed on the active surface exposes the first patterned-metal layer. The second patterned-metal layer includes UBM layers covering the source, gate and drain electrodes and a connecting metal layer covering the connecting trace and extending to the edge to electrically connect the drain region. The solder balls are disposed on the UBM layers.

9 Claims, 8 Drawing Sheets

(51) Int. Cl.
*H01L 21/78* (2006.01)
*H01L 23/00* (2006.01)

(52) U.S. Cl.
CPC .............. *H01L 24/03* (2013.01); *H01L 24/05* (2013.01); *H01L 24/13* (2013.01); *H01L 2224/02371* (2013.01); *H01L 2224/02372* (2013.01); *H01L 2224/0345* (2013.01); *H01L 2224/0346* (2013.01); *H01L 2224/0347* (2013.01); *H01L 2224/03914* (2013.01); *H01L 2224/0401* (2013.01); *H01L 2224/05572* (2013.01); *H01L 2224/05582* (2013.01); *H01L 2224/05611* (2013.01); *H01L 2224/05639* (2013.01); *H01L 2224/11* (2013.01); *H01L 2224/131* (2013.01); *H01L 2224/94* (2013.01); *H01L 2924/00014* (2013.01)

(56) References Cited

U.S. PATENT DOCUMENTS

| | | | | |
|---|---|---|---|---|
| 7,271,498 | B2* | 9/2007 | Huang | H01L 24/11 257/736 |
| 8,361,865 | B2 | 1/2013 | Kobayashi | |
| 8,487,371 | B2 | 7/2013 | Kinzer et al. | |
| 8,716,063 | B2 | 5/2014 | Feng et al. | |
| 2007/0287278 | A1* | 12/2007 | Daubenspeck | H01L 24/03 438/612 |
| 2009/0194880 | A1* | 8/2009 | Feng | H01L 24/03 257/771 |
| 2009/0315175 | A1 | 12/2009 | Okada et al. | |
| 2011/0073943 | A1 | 3/2011 | Hebert | |
| 2011/0233766 | A1* | 9/2011 | Lin | H01L 24/11 257/737 |
| 2012/0104580 | A1* | 5/2012 | Feng | H01L 21/561 257/673 |
| 2014/0367770 | A1 | 12/2014 | Aoki et al. | |
| 2015/0130051 | A1* | 5/2015 | Huang | H01L 24/17 257/737 |

FOREIGN PATENT DOCUMENTS

| | | |
|---|---|---|
| TW | 200937590 | 9/2009 |
| TW | 201041089 | 11/2010 |

OTHER PUBLICATIONS

"Office Action of Taiwan Counterpart Application," issued on Dec. 13, 2016, p. 1-p. 17.

* cited by examiner

POWER MOSFET AND MANUFACTURING METHOD THEREOF

CROSS-REFERENCE TO RELATED APPLICATION

This application claims the priority benefit of Taiwan application no. 104112061, filed on Apr. 15, 2015. The entirety of the above-mentioned patent application is hereby incorporated by reference herein and made a part of this specification.

BACKGROUND OF THE INVENTION

Field of the Invention

The invention relates to a semiconductor component and a manufacturing method thereof and more particularly relates to a power MOSFET and a manufacturing method thereof.

Description of Related Art

In current semiconductor devices, power metal oxide semiconductor field effect transistors (MOSFETs) are used in a large quantity of electronic equipments, including power sources, automobile electronics, computers, and battery-powered devices, such as smartphones. Power MOSFETs can be used for a wide variety of applications, for example, connecting a power source to a switch of a specific electronic device having a load.

A power MOSFET applies an appropriate voltage to a gate of a power MOSFET, such that the device begins to conduct, so as to form a channel connecting a source and a drain of the power MOSFET, allowing current to flow. When the power MOSFET begins to conduct, the relationship between the current and the voltage substantially presents as a linear relationship, such that the device can serve the purpose of resistance.

Generally, transistors (including power MOSFETs) in a conducting state should have lower drain-source resistance. Vertical power MOSFETs achieve a low drain-source resistance effect by disposing the drain on a surface opposite another surface of the source contact. Disposing the drain on the opposite surface relative to the source contact shortens the conducting path of the current, thereby reducing the drain-source resistance.

However, when packaging transistors using wafer level chip scale packaging (WLCSP), all contacts (including source contact, drain contact, and gate contact) are required to be disposed on the same surface (on the same side) of the package. Only such configuration can easily connect the surface connected to each transistor terminal in the package to the circuit board using solder balls. Therefore, disposing the drain and the drain contact on the surface opposite the surface of the source contact raises difficulty in packaging the power MOSFET since such configuration must simultaneously provide electrical connection to the two opposite sides of the package. Therefore, the industry is still currently in dire need of a packaging method capable of enabling the power MOSFET to maintain good electrical efficiency and low drain-source resistance.

SUMMARY OF THE INVENTION

The invention provides a power MOSFET and a manufacturing method thereof capable of enhancing the electrical efficiency of the power MOSFET.

The power MOSFET of the invention includes a substrate, a first patterned metal layer, a patterned dielectric layer, a second patterned metal layer, and a plurality of solder balls. The substrate includes an active surface, a back surface opposite to the active surface, a source region, a gate region, and a drain region. The source region and the gate region are located on the active surface, whereas the drain region is located on the back surface. The first patterned metal layer is disposed on the active surface and includes a source electrode, a gate electrode, a drain electrode and a connecting trace. The source electrode and the gate electrode are electrically connected to the source region and the gate region respectively. The connecting trace is located at an edge of the substrate and electrically connected to the drain electrode. The patterned dielectric layer is disposed on the active surface and exposes the first patterned metal layer. The second patterned metal layer includes a plurality of UBM layers and a connecting metal layer. The plurality of UBM layers cover the source electrode, the gate electrode, and the drain electrode respectively. The connecting metal layer covers and connects the connecting trace and extends to the edge, so as to be electrically connected to the drain region via the edge. The plurality of solder balls are disposed on the plurality of UBM layers respectively.

A manufacturing method of a power MOSFET of the invention includes the following steps. First of all, a wafer is provided. The wafer includes a plurality of chips. Each of the plurality of chips includes an active surface, a back surface opposite to the active surface, a first patterned metal layer, a source region, a gate region, and a drain region. The first patterned metal layer includes a source electrode, a gate electrode, a drain electrode and a connecting trace. The source electrode and the gate electrode are electrically connected to the source region and the gate region located on the active surface respectively. The connecting trace is located at an edge of each of the plurality of chips and electrically connects the drain electrode. The drain region is located on the back surface. Next, a patterned dielectric layer is formed on the active surface and exposes the first patterned metal layer. Next, a second patterned metal layer is formed on the first patterned metal layer. The second patterned metal layer includes a plurality of UBM layers and a connecting metal layer. The plurality of UBM layers cover the source electrode, the gate electrode, and the drain electrode respectively. The connecting metal layer covers and connects the connecting trace and extends to the edge, so as to be electrically connected to the drain region via the edge. Afterwards, a plurality of solder balls are formed on the plurality of UBM layers respectively.

In an embodiment of the invention, the power MOSFET further includes a patterned protection layer disposed on the active surface and exposing the first patterned metal layer, and the patterned dielectric layer being disposed on the patterned protection layer.

In an embodiment of the invention, the power MOSFET further includes a seed layer disposed between the first patterned metal layer and the second patterned metal layer.

In an embodiment of the invention, the connecting metal layer extends to a side surface of the chip, so as to be electrically connected to the drain region on the back surface.

In an embodiment of the invention, the power MOSFET further includes a through silicon via (TSV) penetrating the substrate to interconnect the active surface and the back surface, the connecting metal layer is electrically connected to the TSV, so as to be electrically connected to the drain region on the back surface through the TSV.

In an exemplary embodiment of the invention, a thickness of the connecting trace is substantially between 3 μm to 5 μm.

In an embodiment of the invention, a thickness of the second patterned metal layer is substantially between 8 μm to 10 μm.

In an embodiment of the invention, a material of the second patterned metal layer includes tin or silver.

In an embodiment of the invention, the power MOSFET further includes a metal coating covering the back surface.

In an embodiment of the invention, the manufacturing method of the power MOSFET further includes the following steps: before the patterned dielectric layer is formed on the active surface, a patterned protection layer is formed on the active surface and exposing the first patterned metal layer, and the patterned dielectric layer is disposed on the patterned protection layer.

In an embodiment of the invention, the manufacturing method of the power MOSFET further includes the following steps: a seed layer is formed before the second patterned metal layer is formed on the first patterned metal layer, the seed layer covers the patterned dielectric layer and the first patterned metal layer exposed by the patterned dielectric layer. Next, a patterned photoresist layer is formed on the seed layer, and the patterned photoresist layer exposes the seed layer on the first patterned metal layer and on a portion of the patterned dielectric layer surrounding the first patterned metal layer.

In an embodiment of the invention, the second patterned metal layer is formed on the seed layer exposed by the patterned photoresist layer.

In an embodiment of the invention, the manufacturing method of the power MOSFET further includes the following steps: the patterned photoresist layer is removed after the second patterned metal layer is formed on the first patterned metal layer. Next, the seed layer exposed by the second patterned metal layer is removed.

In an embodiment of the invention, the manufacturing method of the power MOSFET further includes the following steps: a through silicon via penetrating the substrate is formed to interconnect the active surface and the back surface, wherein the connecting metal layer is electrically connected to the through silicon via.

In an embodiment of the invention, the manufacturing method of the power MOSFET further includes the following steps: a thinning process is performed on the chip from the back surface.

In an embodiment of the invention, the thinning process includes mechanical grinding.

In an embodiment of the invention, the manufacturing method of the power MOSFET further includes the following steps: a metal coating is formed on the back surface.

In an embodiment of the invention, the manufacturing method of the power MOSFET further includes the following steps: a singularizing process is performed to the wafer, so as to form a plurality of power MOSFETs separated from each other.

Accordingly, the manufacturing method of the power MOSFET of the invention uses the same process to simultaneously form the UBM layers covering the gate electrode, the source electrode and the drain electrode, and the connecting metal layer located at the edge of the chip and electrically connected to the drain electrode. In addition, the connecting metal layer extends to the edge of the chip, so as to be electrically connected to the drain region on the back surface of the chip through the edge. With such configuration, the drain region is disposed on the back surface of the chip, such that the drain region and the source region are located on two opposite surfaces of the chip, shortening the conducting path of the current, thereby reducing drain-source resistance. In addition, the gate electrode is disposed on the active surface of the chip, and then extends to the edge region of the chip through the connecting trace, so as to be electrically connected to the drain region on the back surface of the chip from the edge of the chip through the connecting metal layer, such that the gate electrode, the source electrode, and the drain electrode are all disposed on the active surface of the chip to facilitate the power MOSFET to be electrically connected to an external circuit board through the solder balls.

Furthermore, the connecting metal layer for electrically connecting the drain electrode and the drain region is formed by using the same plating process as the UBM layers. Thus, no additional processing steps are required. In addition, since the connecting metal layer is formed through the plating process, a thickness of the connecting metal layer is thicker than the thicknesses of the drain electrode and the connecting trace (namely, the thickness of the first patterned metal layer) formed by sputtering process. Therefore, the connecting metal layer is capable of bearing higher current. Therefore, the power MOSFET formed using the above-mentioned manufacturing method of the invention has excellent electrical efficiency.

To make the above and other features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In the following detailed description of each of the embodiments, reference is made to the accompanying drawings which form a part hereof, and in which are shown by way of illustration specific embodiments in which the invention may be practiced. In this regard, directional terminology, such as "top," "bottom," "front," "back," "left," "right," etc., is used with reference to the orientation of the Figure(s) being described. Because components of embodiments can be positioned in a number of different orientations, the directional terminology is used for purposes of illustration and is in no way limiting. In addition, in each of the following embodiments, the same or similar elements adopt the same or similar reference numerals.

FIG. 1A to FIG. 1J are schematic diagrams of a process of manufacturing a power MOSFET according to an embodiment of the invention. A manufacturing method of the power metal oxide semiconductor field effect transistor (MOSFET) of the embodiment includes the following steps.

Figure 1A:
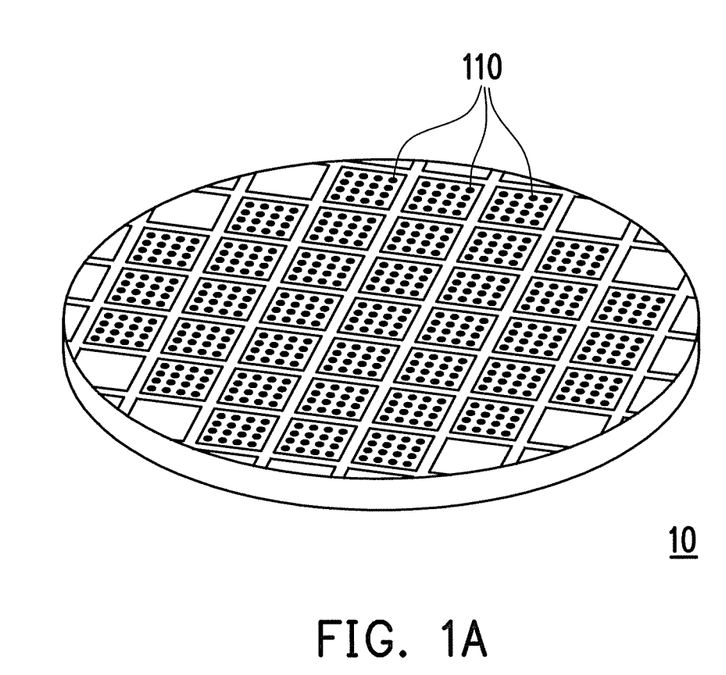
FIG. 1A to FIG. 1J are schematic view of a process of manufacturing a power MOSFET according to an embodiment of the invention.
Figure 1B:
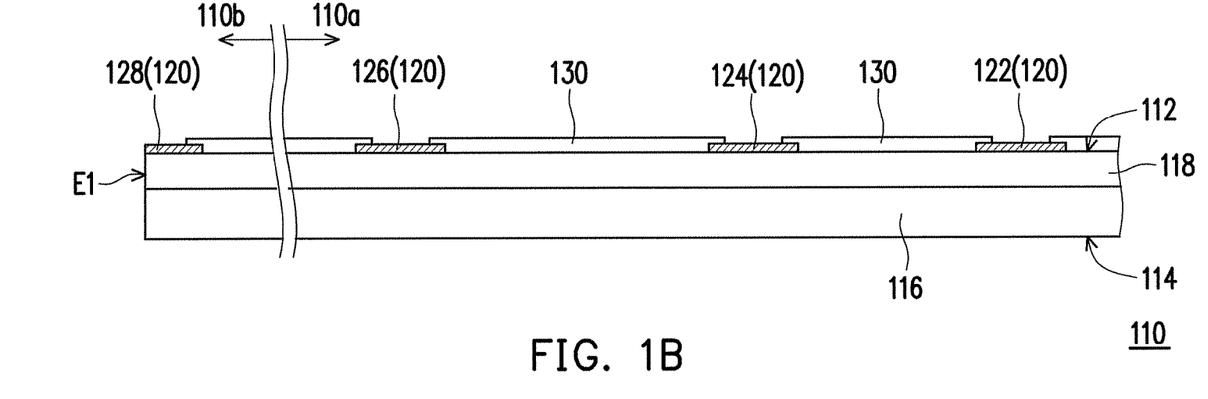

Please refer to both FIG. 1A and FIG. 1B, first of all, a wafer 10 as shown in FIG. 1A is provided. The wafer 10 includes a plurality of chips 110. The chips 110 are, for example, arranged in an array. It is noted that for the drawings to be clean and to present the structure of each of the chips 110 more clearly, FIG. 1B to FIG. 1J merely illustrate cross-sectional schematic views of manufacturing processes of a single chip 110 in the wafer 10. Each of the chips 110, as shown in FIG. 1B, includes an active surface 112, a back surface 114 opposite to the active surface 112, a first patterned metal layer 120, a source region, a gate region, and a drain region 116. The first patterned metal layer 120 includes a source electrode 122, a gate electrode 124, a drain electrode 126 and a connecting trace 128, wherein the source region and the gate region are located on the active surface 112 of the chip 110, whereas the drain region 116 is located on the back surface 114 of the chip 110. The source electrode 122 and the gate electrode 124 electrically connect to the source region and the gate region located on the active surface 112 respectively. The connecting trace 128 is located at an edge E1 of each of the chips 110 and electrically connected to the drain electrode 126.

More specifically, each of the chips 110 includes an active region 110a and an edge region 110b. The edge region 110b is, for example, disposed to surround the active region 110a and connects the active region 110a. The source electrode 122, the gate electrode 124, and the drain electrode 126, as shown in FIG. 1A, are located at the active region 110a of the chip 110, whereas the connecting trace 128 is located at the edge region 110b of the chip 110 and extends to the edge E1 of the chip 110, and the connecting trace 128 is electrically connected to the drain electrode 126.

In addition, in the embodiment, the chip 110, as shown in FIG. 1B, further includes a patterned protection layer 130 disposed on the active surface 112 and exposes the first patterned metal layer 120. In the embodiment, the first patterned metal layer 120 is formed by a sputtering process, and a thickness thereof (that is, the thicknesses of the source electrode 122, the gate electrode 124, the drain electrode 126 and the connecting trace 128) is approximately between 3 µm to 5 µm. In addition, at the time, the drain electrode 126 and the connecting trace 128 are floating traces. In other words, besides electrically connecting each other, the drain electrode 126 and the connecting trace 128 are not electrically connected to other traces.

More specifically, the chip 110 includes a base and an epitaxial layer 118. The base serves as the drain region 116 and has a first conductivity type, and the epitaxial layer 118 is formed on the drain region 116 and has the first conductivity type. In the embodiment, the base is, for example, a heavily doped N-type silicon base. The epitaxial layer 118 is, for example, a lightly doped N-type epitaxial layer, and a forming method thereof includes performing a selective epitaxy growth (SEG) process. Next, for example, a main body layer having a second conductivity type is formed in the epitaxial layer 118. The main body layer is, for example, a P-type main body layer, and a forming method thereof includes performing an ion implantation process and a subsequent drive-in process. Naturally, the embodiment is merely for illustration, and the invention does not limit the conductivity type of the base, the epitaxial layer and the main body layer.

In an embodiment of the invention, a pad oxide layer can also be optionally formed on the base after the step of forming the epitaxial layer 118 and before the step of forming the main body layer. The pad oxide layer prevents a tunneling effect caused by performing the ion implantation process to form the main body layer. A material of the pad oxide layer is, for example, silicon oxide, and a forming method thereof is, for example, performing a thermal oxidation process.

Figure 1C:
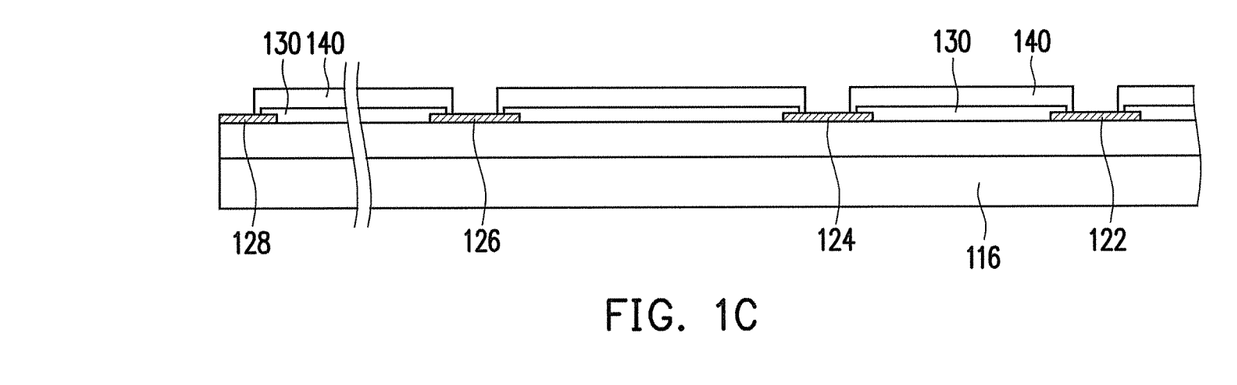
Figure 1D:
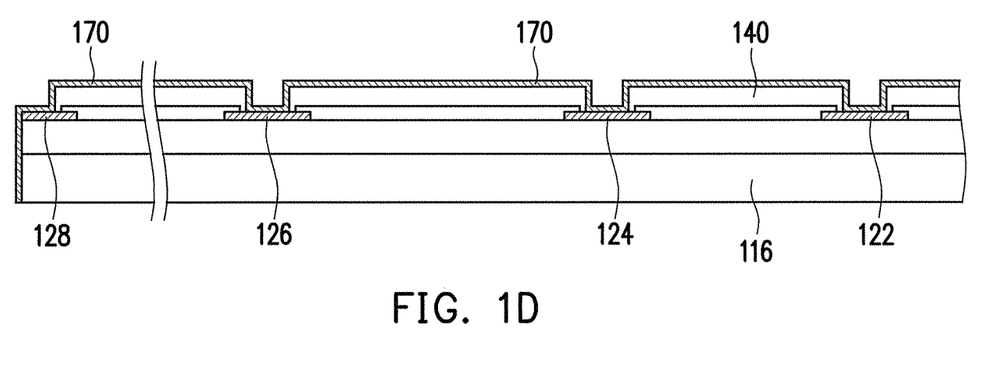

Next, please refer to FIG. 1C, a patterned dielectric layer 140 is formed on the active surface 112. In detail, the patterned dielectric layer 140 is formed on and covers the patterned protection layer 130 and exposes the first patterned metal layer 120. Afterwards, a seed layer 170 as shown in FIG. 1D is formed. The seed layer 170 comprehensively covers the patterned dielectric layer 140 and the first patterned metal layer 120 exposed by the patterned dielectric layer 140. In the embodiment, a method of forming the seed layer 170 may include sputtering.

Figure 1E:
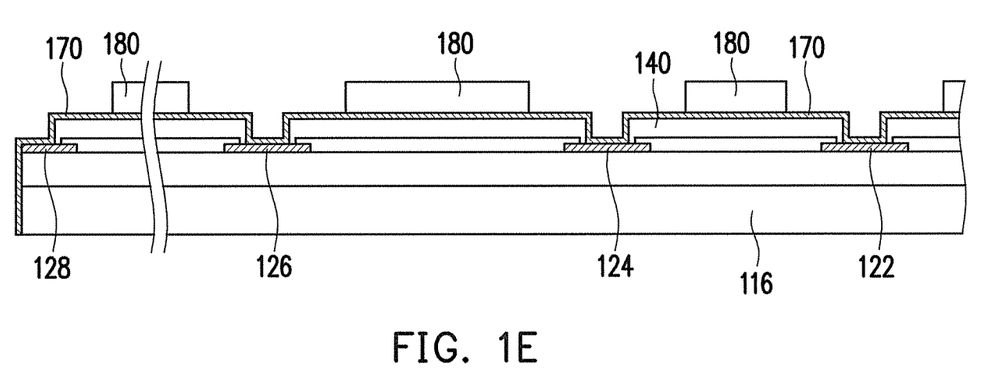

Next, please refer to FIG. 1E, a patterned photoresist layer 180 is formed on the seed layer 170, wherein the patterned photoresist layer 180, as shown in FIG. 1E, exposes the seed layer 170 on the first patterned metal layer 120 and a portion of the patterned dielectric layer 140 surrounding the first patterned metal layer 120. In the embodiment, the patterned photoresist layer 180, for example, has cleavage properties (positive type photosensitive materials) or bonding properties (negative type photosensitive materials), such that the patterned photoresist layer 180, as shown in FIG. 1E, is formed by photolithography process.

Figure 1F:
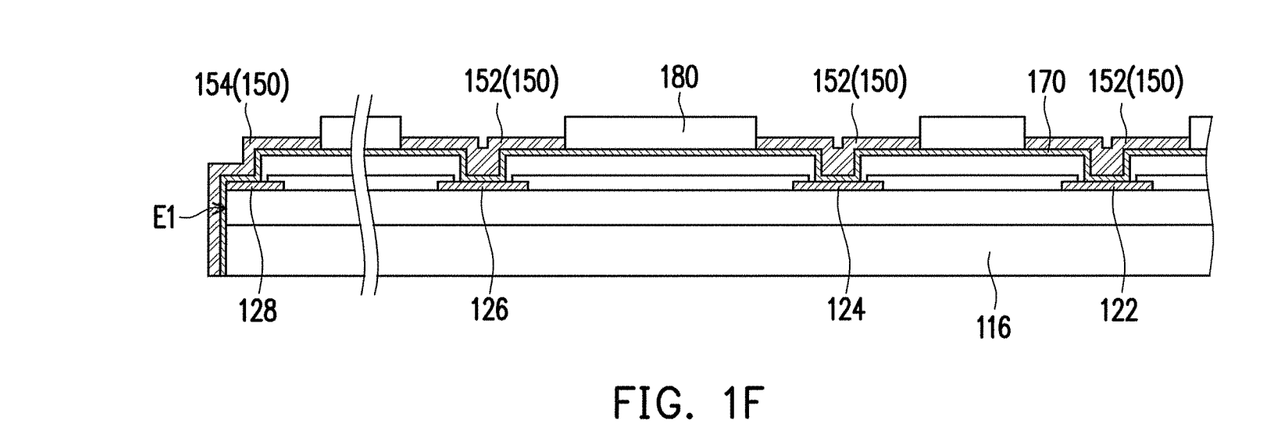

Next, please refer to FIG. 1F, a second patterned metal layer 150 is formed on the first patterned metal layer 120. In detail, the second patterned metal layer 150 is formed by plating process with the seed layer 170 exposed by the patterned photoresist layer 180 serving as an electrode. Therefore, the second patterned metal layer 150 is formed on the seed layer 170 exposed by the patterned photoresist layer 180. In the embodiment, since the second patterned metal layer 150 is formed through plating, the thickness of the second patterned metal layer 150 is thicker than the thickness of the first patterned metal layer 120 formed by sputtering. In other words, the thickness of the second patterned metal layer 150 is greater than the thickness of the first patterned metal layer 120. More specifically, the thickness of the second patterned metal layer 150 is approximately between 8 µm to 10 µm, and a material of the second patterned metal layer 150 includes tin or silver. The second patterned metal layer 150, as shown in FIG. 1F, includes a plurality of UBM layers 152 and a connecting metal layer 154, wherein the UBM layers 152 cover the source electrode 122, the gate electrode 124, and the drain electrode 126 respectively, whereas the connecting metal layer 154 covers and connects the connecting trace 128, and extends to the edge E1, so as to be electrically connected to the drain region 116 on the back surface 114 of the chip 110 via the edge E1. With such configuration, the connecting metal layer 154 of the second patterned metal layer 150 electrically connects the drain electrode 126 on the active surface 112 to the drain region 116 on the back surface 114 through the edge E1, since the connecting metal layer 154 has a thicker thickness, the connecting metal layer 154 is thus capable of bearing higher current. Therefore, the present embodiment enhances the electrical efficiency of the power MOSFET.

In the embodiment, a through hole may be disposed at the edge E1 of each of the chips 110, and the connecting metal layer 154 on each of the chips 110, for example, extends from the edge E1 to a side wall of the through hole of each of the chips 110, so as to be electrically connected to the drain region 116 on the back surface 114 through each of the through hole. For example, the through hole is disposed at four corners of each of the chips 110 where the adjacent chips 110 connected to each other. Naturally, the embodiment does not limit the manner of the connecting metal layer 154 electrically connected to the drain region 116 on the back surface 114 of the chip 110 via the edge E1.

Figure 1G:
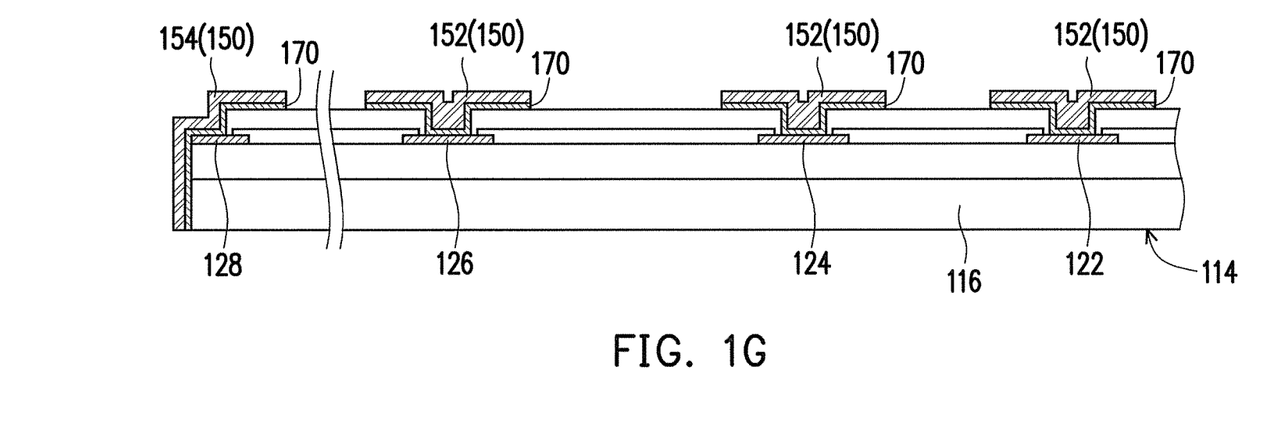

Next, please refer to FIG. 1G, the patterned photoresist layer 180 is removed to expose the seed layer 170 underneath. Next, a portion of the seed layer 170 not covered by the second patterned metal layer 150 is removed by, for example, an etching process. In other words, the seed layer 170 exposed by the second patterned metal layer 150 is removed.

Figure 1H:
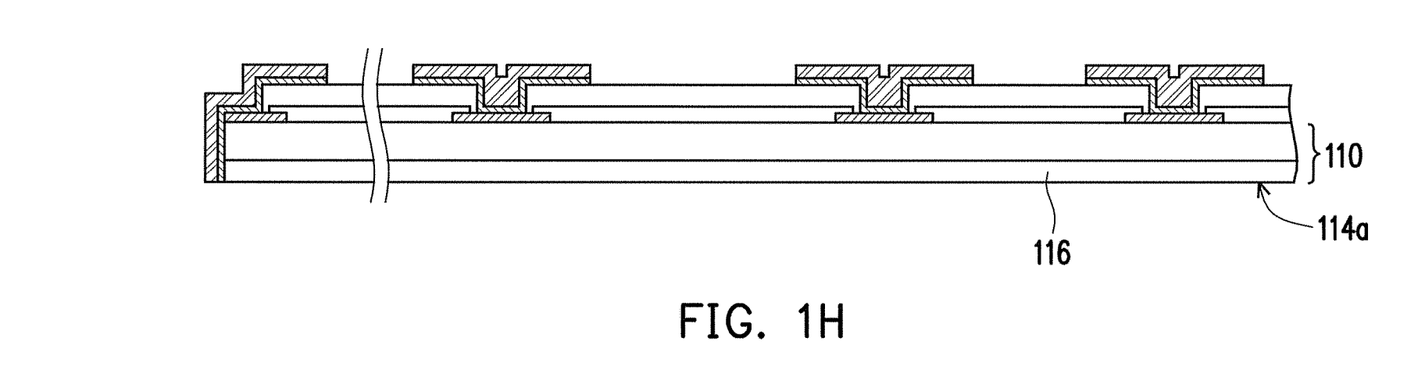
Figure 1I:
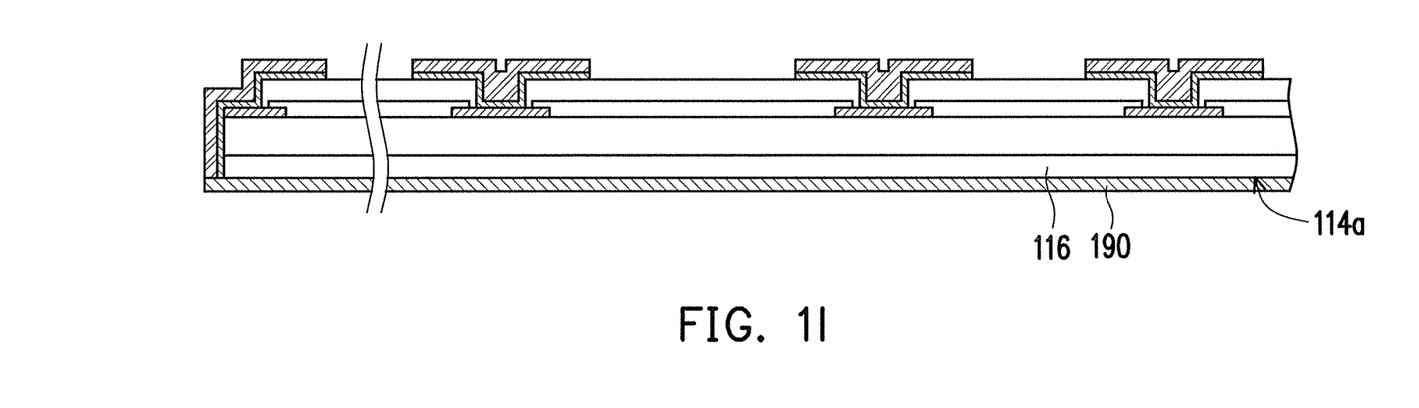
Figure 1J:
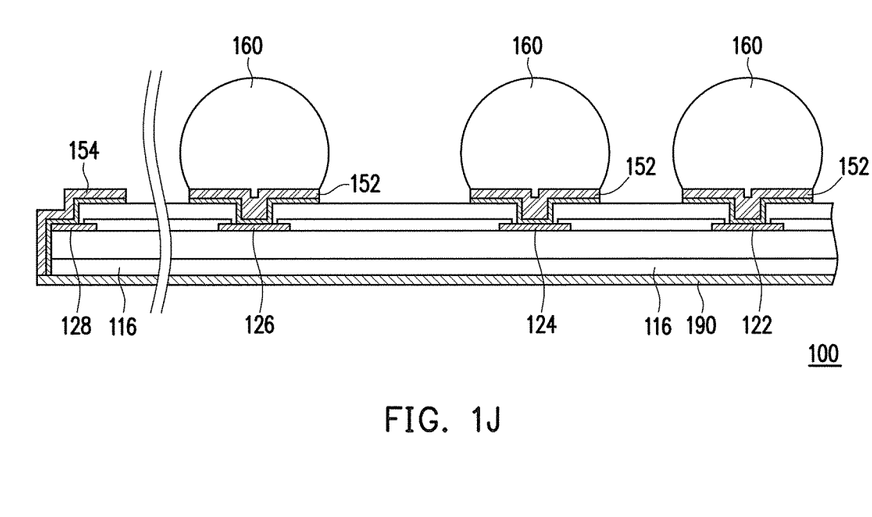

Next, as shown in FIG. 1H, a thinning process is performed to the chip 110 from the back surface 114 of the chip 110, wherein the thinning process includes mechanical grinding. Naturally, the embodiment does not limit the method of thinning the thickness of the chip 110. Afterwards, as shown in FIG. 1F, a metal coating 190 is formed on a back surface 114a of the chip 110 after thinning process to cover the back surface 114a. Naturally, if the embodiment has not performed the thinning process to the chip 110, then the metal coating 190 is formed at the back surface 114 to cover the back surface 114. Afterwards, as shown in FIG. 1J, a plurality of solder balls 160 are then formed on the UBM layers 152 of the second patterned metal layer 150 respectively, so as to form the power MOSFET 100 as shown in FIG. 1J.

Figure 2:
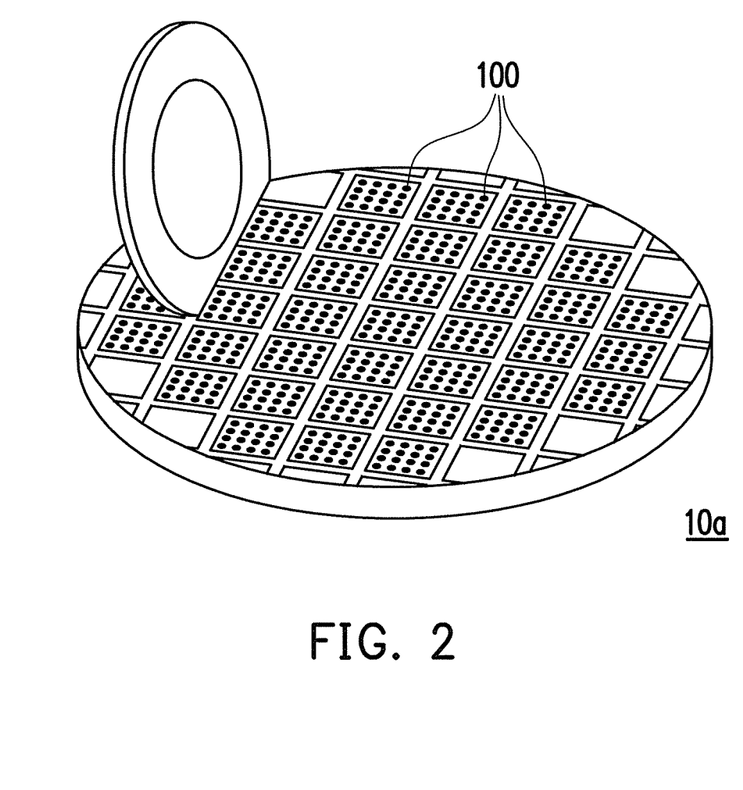
FIG. 2 is a schematic view of performing a monomeric process to a wafer according to an embodiment of the invention.

FIG. 2 is a schematic diagram of performing a monomeric process to a wafer according to an embodiment of the invention. Next, please refer to FIG. 2, a singularizing process is performed to the wafer 10a after performing the above-mentioned processes, so as to form a plurality of power MOSFETs 100 separated from each other, as shown in FIG. 1J. At this point, the manufacturing method of the power MOSFET 100 may be completed.

Figure 3:
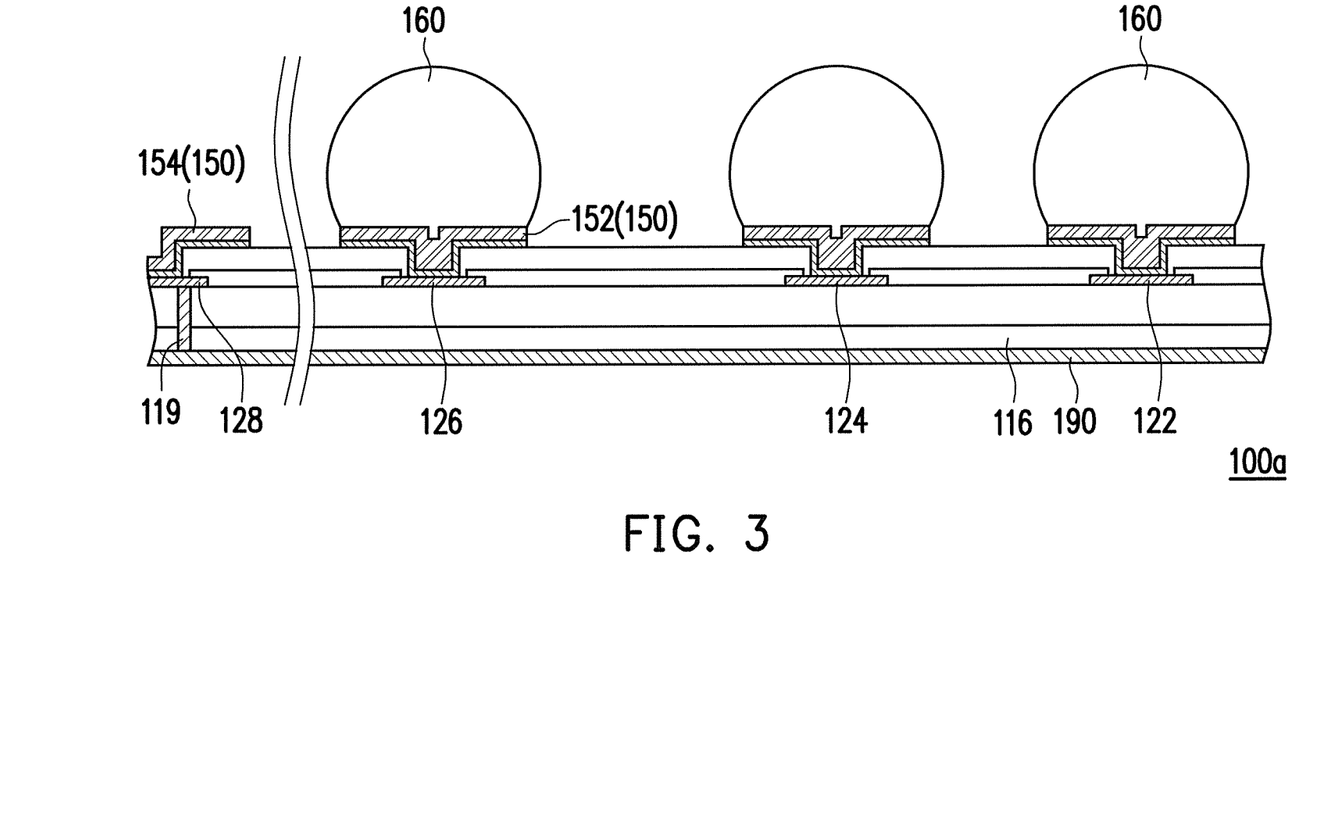
FIG. 3 is a schematic view of a power MOSFET according to another embodiment of the invention.

FIG. 3 is a schematic diagram of a power MOSFET according to another embodiment of the invention. It is noted that the power MOSFET 100a of this embodiment is similar to the power MOSFET 100 of FIG. 1J. Therefore, this embodiment adopts the reference numerals of elements and partial content of the above embodiments, wherein the same reference numerals are adopted to indicate the same or similar elements, and descriptions of the same technical content are omitted. Regarding descriptions of the omitted portions, the above embodiments can be referred, and the descriptions are not repeated in this embodiment. Please refer to FIG. 3. The following paragraphs provide descriptions regarding the differences between the power MOSFET 100a of this embodiment and the power MOSFET 100 of FIG. 1J.

The manufacturing method of the power MOSFET 100a of this embodiment is similar to the manufacturing method of the power MOSFET 100, but the steps thereof further include forming a through silicon via (TSV) 119, penetrating the chip 110 to interconnect the active surface 112 and the back surface 114 thereof, wherein the connecting metal layer 154 extends toward the edge E1 of the chip 110 and electrically connects the TSV 119, so as to be electrically connected to the drain region 116 on the back surface 114 through the TSV 119. In this case, the connecting metal layer 154 does not need to extend to a side surface of the chip 110, and merely needs to extend toward the edge E1 of the chip 110 to be connected to the TSV 119, and the connecting metal layer 154 is electrically connected to the drain region 116 on the back surface 114 through the TSV 119. Naturally, this embodiment is only for illustration, and the invention does not limit the manner of the electrical connection between the connecting metal layer 154 and the drain region 116.

As such, the power MOSFET 100/100a formed by the above-mentioned manufacturing method includes a substrate 110, a first patterned metal layer 120, a patterned dielectric layer 140, a second patterned metal layer 150, and a plurality of solder balls 160. Here, the substrate 110 of the power MOSFET 100/100a is the above-mentioned chip 110, which includes an active surface 112, a back surface 114 opposite to the active surface 112, a source region, a gate region, and a drain region 116. The source region and the gate region are located on the active surface 112, whereas the drain region 116 is located on the back surface 114. The first patterned metal layer 120 is disposed on the active surface 112 and includes a source electrode 122, a gate electrode 124, a drain electrode 126 and a connecting trace 128. The source electrode 122 and the gate electrode 124 are electrically connected to the source region and the gate region respectively. The connecting trace 128 is located at an edge E1 of the substrate 110 and electrically connected to the drain electrode 126. The patterned dielectric layer 140 is disposed on the active surface 112 and exposes the first patterned metal layer 120. The second patterned metal layer 150 includes a plurality of UBM layers 152 and a connecting metal layer 154. The UBM layers 152 cover the source electrode 122, the gate electrode 124, and the drain electrode 126 respectively. The connecting metal layer 154 covers and connects the connecting trace 128, and extends to the edge E1, so as to be electrically connected to the drain region 116 via the edge E1. In this embodiment, the thickness of the second patterned metal layer 150 is greater than the first patterned metal layer 120, such that the second patterned metal layer 150 is capable of bearing higher current to electrically connect the drain electrode 126 and the drain region 116. The solder balls 160 are disposed on the UBM layers 152 respectively.

More specifically, in this embodiment, the power MOSFET 100/100a further includes a patterned protection layer 130 and a seed layer 170, wherein the patterned protection layer 130 is disposed on the active surface 112 and exposes the first patterned metal layer 120, whereas the patterned dielectric layer 140 is disposed on the patterned protection layer 130. The seed layer 170 is disposed between the first patterned metal layer 120 and the second patterned metal layer 150.

Furthermore, in the embodiment of FIG. 1J, the connecting metal layer 154 of the power MOSFET 100 extends from the edge E1 to a side surface of the substrate 110, so as to be electrically connected to the drain region 116 on the back surface 114 of the substrate 110. In the embodiment of FIG. 3, the power MOSFET 100a further includes a through silicon via (TSV) 119, penetrating the substrate 110 to interconnect the active surface 112 and the back surface 114. The connecting metal layer 154 then extends toward the edge E1 and electrically connects the TSV 119, so as to be electrically connected to the drain region 116 on the back surface 114 through the TSV 119. Naturally, the embodiments are merely for illustration, and the invention does not limit the manner of the electrical connection between the connecting metal layer 154 and the drain region 116.

In summary of the above, the invention adopts the same plating process to simultaneously form the UBM layers covering the gate electrode, the source electrode and the drain electrode, and the connecting metal layer located at the edge region of the chip and electrically connected to the drain electrode. In addition, the connecting metal layer extends to the edge of the chip, so as to electrically connect the drain region on the back surface of the chip via the edge. With such configuration, the drain region is disposed on the back surface of the chip, such that the drain region and the source region are located on two opposite surfaces of the chip, shortening the conducting path of the current, thereby reducing drain-source resistance. In addition, the gate electrode is disposed on the active surface of the chip, and extends to the edge of the chip through the connecting trace, so as to be electrically connected to the drain region on the back surface of the chip from the edge of the chip through the connecting metal layer, such that the gate electrode, the source electrode, and the drain electrode are all disposed on the active surface of the chip to facilitate the power MOSFET to be electrically connected to an external circuit board through the solder balls.

Furthermore, the connecting metal layer for electrically connecting the drain electrode and the drain region is formed by the same plating process as the UBM layers are. Thus, no additional processing steps are required. In addition, since the connecting metal layer is formed by plating process, a thickness of the connecting metal layer is thicker than the thicknesses of the drain electrode and the connecting trace formed by the sputtering process. Therefore, the connecting metal layer is capable of bearing higher current. Therefore, the power MOSFET using the connecting metal layer to electrically connect the drain electrode and the drain region has excellent electrical efficiency.

Although the present invention has been described with reference to the above embodiments, it will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A manufacturing method of a power MOSFET, comprising:
    providing a wafer, the wafer comprising a plurality of chips, each of the plurality of chips comprising an active surface, a back surface opposite to the active surface, a first patterned metal layer, a source region, a gate region, and a drain region, the first patterned metal layer comprising a source electrode, a gate electrode, a drain electrode and a connecting trace, the source electrode and the gate electrode electrically connecting to the source region and the gate region located on the active surface respectively, the connecting trace located at an edge of each of the plurality of chips and electrically connected to the drain electrode, and the drain region located on the back surface;
    forming a patterned dielectric layer on the active surface and exposing the first patterned metal layer;
    forming a seed layer on the first patterned metal layer, the seed layer covering the patterned dielectric layer and the first patterned metal layer exposed by the patterned dielectric layer;
    forming a patterned photoresist layer on the seed layer, the patterned photoresist layer exposing the seed layer on the first patterned metal layer and on a portion of the patterned dielectric layer surrounding the first patterned metal layer;
    forming a second patterned metal layer on the seed layer exposed by the patterned photoresist layer, the second patterned metal layer comprising a plurality of under ball metal (UBM) layers and a connecting metal layer, the plurality of UBM layers covering the source electrode, the gate electrode, and the drain electrode respectively, the connecting metal layer covering and connecting the connecting trace and extending to the edge, so as to be electrically connected to the drain region via the edge;
    removing the patterned photoresist layer after forming the second patterned metal layer;
    removing the seed layer exposed by the second patterned metal layer; and
    forming a plurality of solder balls on the plurality of UBM layers respectively.

2. The manufacturing method of the power MOSFET as claimed in claim 1, wherein each of the plurality of chips further comprises:
    a patterned protection layer disposed on the active surface and exposing the first patterned metal layer, the patterned dielectric layer covering the patterned protection layer.

3. The manufacturing method of the power MOSFET as claimed in claim 1, further comprising:
    forming a through silicon via (TSV) at the edge of each of the plurality of chips, penetrating each of the plurality of chips to interconnect the active surface and the back surface, wherein the connecting metal layer is electrically connected to the TSV, so as to electrically connect to the drain region on the back surface through the TSV.

4. The manufacturing method of the power MOSFET as claimed in claim 1, wherein a thickness of the connecting trace is substantially between 3 μm to 5 μm.

5. The manufacturing method of the power MOSFET as claimed in claim 1, wherein a thickness of the connecting metal layer is substantially between 6 μm to 8 μm.

6. The manufacturing method of the power MOSFET as claimed in claim 1, further comprising:
    performing a thinning process to the chip from the back surface.

7. The manufacturing method of the power MOSFET as claimed in claim 6, wherein the thinning process comprises mechanical grinding.

8. The manufacturing method of the power MOSFET as claimed in claim 1, further comprising:
    forming a metal coating on the back surface.

9. The manufacturing method of the power MOSFET as claimed in claim 1, further comprising:
    performing a singularizing process on the wafer, so as to form a plurality of power MOSFETs separated from each other.

* * * * *